United States Patent [19]

Gulczynski

[11] Patent Number: 5,155,381

[45] Date of Patent: * Oct. 13, 1992

[54] CAPACITIVE LOAD DRIVER WITH BINARY OUTPUT

[76] Inventor: Zdzislaw Gulczynski, P.O. Box 11633, Costa Mesa, Calif. 92627

[*] Notice: The portion of the term of this patent subsequent to Nov. 13, 2008 has been disclaimed.

[21] Appl. No.: 474,488

[22] Filed: Feb. 2, 1990

[51] Int. Cl.⁵ .............................. H03K 3/33
[52] U.S. Cl. .................... 307/270; 307/268; 307/318; 307/632
[58] Field of Search ............. 307/632, 253, 270, 255, 307/239, 268, 446, 440, 318, 236

[56] References Cited

U.S. PATENT DOCUMENTS

| | | | |
|---|---|---|---|
| 3,418,495 | 12/1968 | Bose | 307/239 |
| 3,737,761 | 6/1973 | Walther | 307/632 |
| 4,355,343 | 10/1982 | Gross | 307/632 |
| 4,492,881 | 1/1985 | Anderson et al. | 307/270 |
| 4,877,982 | 10/1989 | Walker | 307/270 |

FOREIGN PATENT DOCUMENTS 60-96922  1/1983  Japan .................. 307/632

Primary Examiner—Stanley D. Miller
Assistant Examiner—Toan Tran

[57] ABSTRACT

The power switch driver is a controlled 4-terminal device for substantially capacitive load, e.g power MOSFET. The switching speed, efficiency and reliability are very high. The switching frequency is inherently limited. The bias supply of the driver may be floating or grounded. The output voltage is approximately two times higher than supply voltage. The energy delivered to the capacitive load is recovered. The driver comprises an inductor for attaining a current and providing binary output voltage. One switch selectively applies the current having any polarity to the supply voltage source. Another switch selectively applies the current having one polarity to ground. A diode applies the binary output voltage having a reverse polarity to ground.

12 Claims, 2 Drawing Sheets

CAPACITIVE LOAD DRIVER WITH BINARY OUTPUT

CROSS REFERENCE TO RELATED APPLICATIONS

This invention is related to the following inventions by the same inventor:
"Switching Power Apparatus Having High Power Factor and Comprising Pair of Converters for Obtaining Fixed or Variable Output Voltage" Ser. No. 665,950 filed Mar. 11, 1991;
"Ultra Efficient Resonant Switching Power Apparatus" Ser. No. 632,546 filed Dec. 24, 1990;
"Switching Power Apparatus with 3-State Driver" Ser. No. 517,853 filed May 2, 1990;
"Bidirectional Switching power Apparatus with AC or DC Output:" U.S. Pat. No. 5,057,990 dated Oct. 15, 1991;
"Ultra Fast Logic with Temperature Condensation and Minimized Supply Voltage" Ser. No. 474,489 filed herewith;
"3-Terminal Bidirectional Switching Power Supply with AC or DC Input and AC or DC Output" Ser. No. 444,729 filed Dec. 1, 1989;
"Switching Power Supply with Constant or Sinusoidal Input Current and with Fixed or Variable Output Voltage" Ser. No. 444,730 filed Dec. 1, 1989;
"Switching Power Supply with Constant or Sinusoidal Input Current" Ser. No. 393,391 filed Aug. 14, 1989;
"Switching Power Supply Comprising Pair of Converters for Obtaining Constant or Sinusoidal Input Current and Fixed or Variable Output Voltage" U.S. Pat. No. 4,999,568 dated Mar. 12, 1991;
"Ultra Efficient Switching Power Amplifier" U.S. Pat. No. 4,980,649 dated Dec. 25, 1990;
"Synchronous Switching Power Supply Comprising Buck Converter" Ser. No. 363,325 filed Jun. 8, 1989;
"Synchronous Switching Power Supply Comprising Boost or Flyback Converter" Ser. No. 363,326 filed Jun. 8, 1989;
"Synchronous Switching Power Supply with Boost and/or Flyback Converters" Ser. No. 363,327 filed Jun. 8, 1989;
"High Power Switching Power Supply" U.S. Pat. No. 4,947,308 dated Aug. 7, 1990;
"High Efficiency Power Factor Correction Circuit" U.S. Pat. No. 4,949,234 dated Aug. 14, 1990;
"High Power Switching Power Supply with High Power Factor" Ser. No. 304,508 filed Jan. 31, 1989;
"High Power Switching Power Supply Having High Power Factor" U.S. Pat. No. 4,956,760 dated Sep. 11, 1990;
"Power Switch Driver" U.S. Pat. No. 4,940,906 dated Jul. 10, 1990;
"Synchronous Switching Power Supply with Flyback Converter" U.S. Pat. No. 4,853,837 dated Aug. 1, 1989;
"High Efficiency Power Amplifier Comprising Multilevel Power Supply" U.S. Pat. No. 4,871,980 dated Oct. 3, 1989;
"Switching Power Amplifier" U.S. Pat. No. 4,763,080 dated Aug. 9, 1988;
"Switching Circuits Performing Thyristor and Triac Functions" U.S. Pat. No. 4,845,391 dated Jul. 4, 1989;
"Switching Power Supply" U.S. Pat. No. 4,803,610 dated Feb. 7, 1989;
"Switching Power Supply" U.S. Pat. No. 4,736,286 dated Apr. 5, 1988; and
"Push-Pull Power Amplifier" U.S. Pat. No. 4,476,441 dated Oct. 9, 1984.

BACKGROUND OF THE INVENTION

The invention generally relates to 4-terminal driver for a substantially capacitive load. In particular, the driven can be used for driving switching power devices having high input capacitance, such as MOSFETs. The driver is characterized by a very high switching speed and is intended to operate in systems requiring a constant or occasional switching, e.g. switching power supplies and switching power amplifiers. The driver can be used as buffer in a driver circuit with floating or grounded bias supply.

The gate impedance of a power MOSFET is a high resistance shunted by a large composite gate capacitance, including Miller effect capacitance. Therefore, the MOSFET requires fairly large input current to change the gate voltage. Due to a limited transconductance, the switching speed of the MOSFET depends upon the rate at which gate charge is supplied or removed. Consequently, the MOSFET driver should minimize any lead inductance by reducing loop areas. For instance, each inch of wire adds about 20 nH of inductance.

The conventional drivers comprise complex current pulse drive circuits. The employment of transformers having a small turns ratio results in large currents which must be delivered to the primary winding. Moreover, numerous problems are introduced. For instance, transformers are bulky and expensive. Their high frequency performance is very poor. Snubber and clamp circuits are necessary to prevent forward and reverse voltage spikes, and reduce RFI. Some other methods significantly improve the performance by employing a level shifter. One technique is bootstrapping, another one is disclosed in the abovementioned "Power Switch Driver" U.S. Pat. No. 4,940,906 dated Jul. 10, 1990, by the same inventor. However, even these techniques do not address the problem of the buffer which explicitly drives capacitive load, e.g. MOSFET. The buffer usually comprises a push-pull output stage with resistors limiting output currents. The level shifter must deliver energy which is wasted in the buffer.

SUMMARY OF THE INVENTION

The present invention is intended to provide controlled 4-terminal power switch driver having very high switching speed, efficiency, reliability and large output current capability including inherent short circuit protection. The bias supply of the driver may be floating or grounded. The output current of the driver is not limited by resistors. Moreover, the energy stored in the capacitive load being discharged is delivered back to the supply voltage source and thus recovered. Most switching is performed at zero voltage and zero current. The output voltage of the driver is approximately two times higher than its supply voltage. The driver inherently limits the switching frequency of the output voltage. This prevents a destruction of power switching devices in case of unstable or erratic operation and determines optimum performance in case of self-oscillating circuit.

The driver employs a series coupled inductor which, in connection with the capacitive load, constitutes a resonant network. The value of the inductor may be very small, wherein lead inductance can be taken into consideration. If necessary, dv/dt rate of a MOSFET can be reduced without using resistors. A capacitor can be placed between gate and source of the MOSFET in order to affect both turn-on and turn-off times. An inductor in parallel with a diode can be coupled in series with the gate of the MOSFET in order to affect either turn-on or turn-off time. The driver can be carried out in integrated form as 4-terminal device.

A driver according to the present invention obtains binary output voltage having one polarity on substantially capacitive load and comprises: a node, an inductive means coupled to the node for attaining a current having one or the other polarity and providing the binary output voltage, a voltage source means for providing a supply voltage, a first switching means coupled to the node for selectively applying the current having any polarity to the voltage source means, a second switching means coupled to the node for selectively applying the current having the one polarity to ground, and a diode means for applying the binary output voltage having the reverse polarity to ground.

In another embodiment the driver further includes: a capacitive means for storing a second supply voltage, and a third switching means for selectively applying the second supply voltage to the binary output voltage.

BRIEF DESCRIPTION OF THE DRAWINGS

The present invention will become more clear in conjunction with the accompanying figures throughout which similar references may denote similar parts and of which.

DETAILED DESCRIPTION OF THE INVENTION

Figure 1:
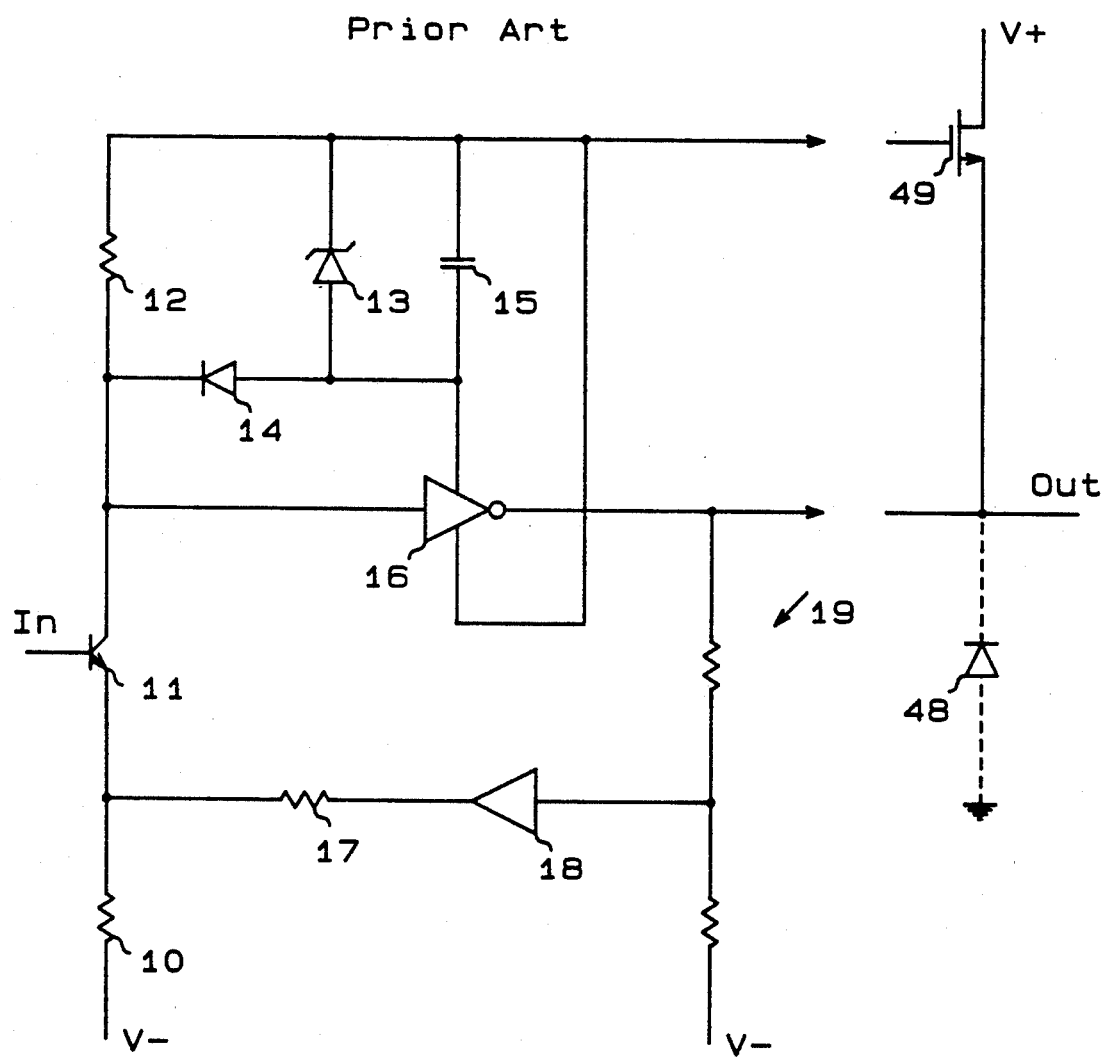
FIG. 1 is the embodiment of the driver with buffer and floating bias supply according to the aforementioned "Power Switch Driver" U.S. Pat. No. 4,940,906 dated Jul. 10, 1990, by the same inventor. By way of example, the driver controls MOSFET 49.

FIG. 1 is the embodiment of the driver with buffer and floating bias supply according to the aforementioned "Power Switch Driver" U.S. Pat. No. 4,940,906 dated Jul. 10, 1990, by the same inventor. The driver outperforms any other technique. In particular, the bootstrap technique requires a number of external components.

One method demands a high power resistor, another one requires a ground referenced bias supply and fast recovery high voltage diode. Bootstrap type driver is referenced to an output voltage at the load. The driver is inoperative if the output voltage does not reach a minimum value, possibly near zero. Moreover, a bootstrap capacitor is charged thru the load and resistor, wherein peak current may be high.

The power switch driver shown in FIG. 1 controls the N-channel power MOSFET 49. The load may be passive, e.g. including a capacitor for storing a voltage. The transistor 49 may be also a part of a switching circuit, e.g. full bridge converter or push-pull output stage. The driver can be carried out in integrated form, wherein the capacitor 15 is the only external component. A current charing the capacitor 15 is constant. The driver does not require positive supply voltage. However, if only such voltage is available, the negative supply voltage V— can be obtained by means of a voltage converter integrated on the same chip. No supply voltage is necessary if minimum output voltage is higher than zener voltage of the diode 13.

The transistor 49 has drain coupled to V+ and provides a source current to the load. A controllable current source is coupled to the resistor 12 and provides a current in response to the input signal. The inverting buffer 16 has an input coupled to the resistor 12 for sensing the voltage thereacross. The resistor 12 has a high value and acts as pull-down resistor for input stage of the buffer 16. The buffer 16 is supplied with the energy stored in the capacitor 15. The optional diode 48 is coupled to the output to ensure proper charging of the capacitor 15 even without the load.

With input voltage low the transistor 49 is turned on. The low voltage is near V— so that the collector current of the NPN transistor 11 is zero. The resistor 12, capacitor 15 and buffer 16 are referenced to one terminal which is coupled to the gate of the transistor 49. The buffer 16 is coupled across the capacitor 15 and supplied from the negative voltage stored therein. The voltage drop across the resistor 12 is zero, whereby the diode 14 is reverse biased. The buffer 16 couples the source of the transistor 49 to the capacitor 15. As a result, the voltage stored therein is applied between the gate and source of the transistor 49, and the voltage at the gate is higher than V+.

With input voltage high the transistor 49 is turned off. The high voltage is greater than V— and results in a predetermined emitter voltage of the transistor 11. The collector current thereof causes a voltage drop across the resistor 12. As a result, the buffer 16 couples the gate and source of the transistor 49 together, whereby the input capacitance thereof is discharged. The voltage drop across the resistor 12 is greater than the supply voltage stored in the capacitor 15, whereby the diode 14 conducts and capacitor 15 is charged. The voltage applied thereto is limited by the zener diode 13. The collector current further flows to the load thru a diode in the output stage of the buffer 16 so that reverse gate-source voltage of the transistor 49 is near zero.

The optional components 17 thru 19 are employed to minimize power loss of the transistor 11. The resistor divider 19 is coupled between the output and V—. The comparator 18 is referenced thereto, and has input offset (threshold) voltage and open collector output. When the input voltage is high, the collector current of the transistor 11 is determined by the resistor 10. However, when the output voltage is below a predetermined value, the comparator 18 couples the resistor 17 to V—, i.e. in parallel with the resistor 10. As a result, the collector current of the transistor 11 is increased. An additional PNP transistor having base and emitter coupled in series with the zener diode 13, and collector coupled to the comparator 18 can be employed. The comparator 18 is disabled when the voltage stored in the capacitor 15 is sufficient, whereby the driver efficiency is further increased.

Figure 2:
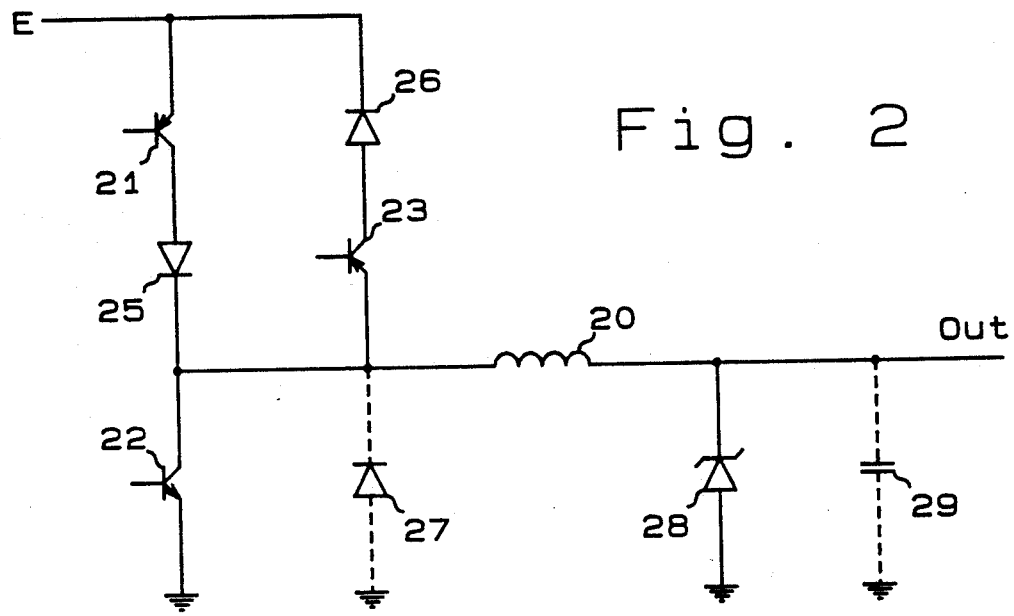
FIG. 2 is the preferred embodiment of the capacitive load driver.

FIG. 2 is the preferred embodiment of the capacitive load driver. Generally, the driver obtains binary output voltage having one polarity on substantially capacitive load. A voltage source provides positive supply voltage E. The inductor 20 attains a positive or negative current, i.e. flowing to or from the output respectively, and provides the binary output voltage. A first switching means selectively applies the inductor current having any polarity to the voltage source. A second switching means selectively applies the negative inductor current to ground. A diode means applies the binary output voltage having the reverse polarity to ground. The inductor 20 is coupled between a node and output of the driver.

Specifically, the first switching means includes a first and second switches conducting the positive and negative inductor currents respectively. The first switch includes the PNP transistor 21 and diode 25 coupled in series therewith. Similarly, the second switch includes the PNP transistor 23 and diode 26 coupled in series therewith. The emitters of the transistors 21 and 23 are coupled to E and node respectively. The cathodes of the diodes 25 and 26 are coupled to the node and E respectively. The diodes 25 and 26 prevent reverse collector currents in the transistors 21 and 23 respectively.

The second switching means includes the NPN transistor 22 having collector and emitter coupled to the node and ground respectively. It may further include the diode 27 having cathode and anode coupled to the node and ground respectively. The diode 27 allows the positive inductor current to ground if the transistor 21 turns off while the inductor current is greater than zero, e.g. under short circuit condition. The diode means consists of the diode 28 having cathode and anode coupled to the output and ground respectively. Zener diode or transient voltage suppressor is used as the diode 28 if a leakage current causes an excessive output voltage. Otherwise, a regular diode can be used. The capacitor 29 is coupled between the output and ground, and represents the capacitive load, e.g. input capacitance of a MOSFET. The capacitor 29 can be also employed to increase the capacitance of the load.

The current flowing thru the inductor 20 and output voltage are referred to as J and V respectively. A switch driver controls the transistors 21 thru 23. It is assumed that saturation voltages thereof and forward voltages of the diodes 25, 26 and 28 are zero, for the purpose of simplicity. The transistor 21 is closed as to increase V from low level, equal to zero, to high level. This is accomplished by coupling the base of the transistor 21 via a resistor to ground. J and V are given by:

$$J = \omega CE \sin \omega t$$

$$V = E(1 - \cos \omega t)$$

where $\omega^2 LC = 1$ and t is the time, L is the inductance of the inductor 20 and C is the capacitance of the load represented by or added to the capacitor 29. Short circuit protection can be accomplished by sensing J or V.

When $t = \pi/\omega$, J is zero, whereas V reaches its peak equal to 2E. The transistor 21 is nonconductive as the diode 25 is reverse biased. The level of V is high. Subsequently, the transistor 22 can be closed as to switch V to low level. This is accomplished by coupling the base of the transistor 22 via a resistor to E. J and V are given now by:

$$J = -2\omega CE \sin \omega t$$

$$V = 2E \cos \omega t$$

The switch driver controls the transistor 23 as to close it. This is accomplished by coupling base of the transistor 23 via a resistor to ground. However, the diode 26 is reverse biased and transistor 23 remains nonconductive. When $t = \pi/(2\omega)$, V reaches zero and J reaches its peak equal to $-2\omega CE$, i.e.

$$Jmax = 2\omega CE$$

The transistor 22 is opened, whereby the transistor 23 takes over J automatically. The diode 28 also conducts, whereby the voltage across the inductor 20 is E and J is falling according to the equation:

$$J = Et/L - 2\omega CE$$

When $t = 2\omega$, J is zero and V can be switched again from low to high level. Maximum switching frequency fmax of the driver is:

$$\begin{aligned} f\text{max} &= 1/[\pi/\omega + \pi/(2\omega) + 2/\omega] = \\ &= J\text{max}/[(3\pi + 4)CE] \end{aligned}$$

Furthermore, $$L = 1/(\omega^2 C) = 4CE^2/J^2 max$$

A practical example may be a MOSFET whose gate and source are coupled to the output of the driver and ground respectively. Input capacitance of the MOSFET is nonlinear and its average value may be 500 pF. On-state gate-source voltage of the MOSFET may be 6 V, wherein E is set to this value. Jmax may be 1A. Applying these values to the last two equations gives fmax = 25 MHz and L = 72 nH. fmax is very high considering that the MOSFET is a power device. The inductor 20 can be carried out in integrated form since L has very small value.

Figure 3:
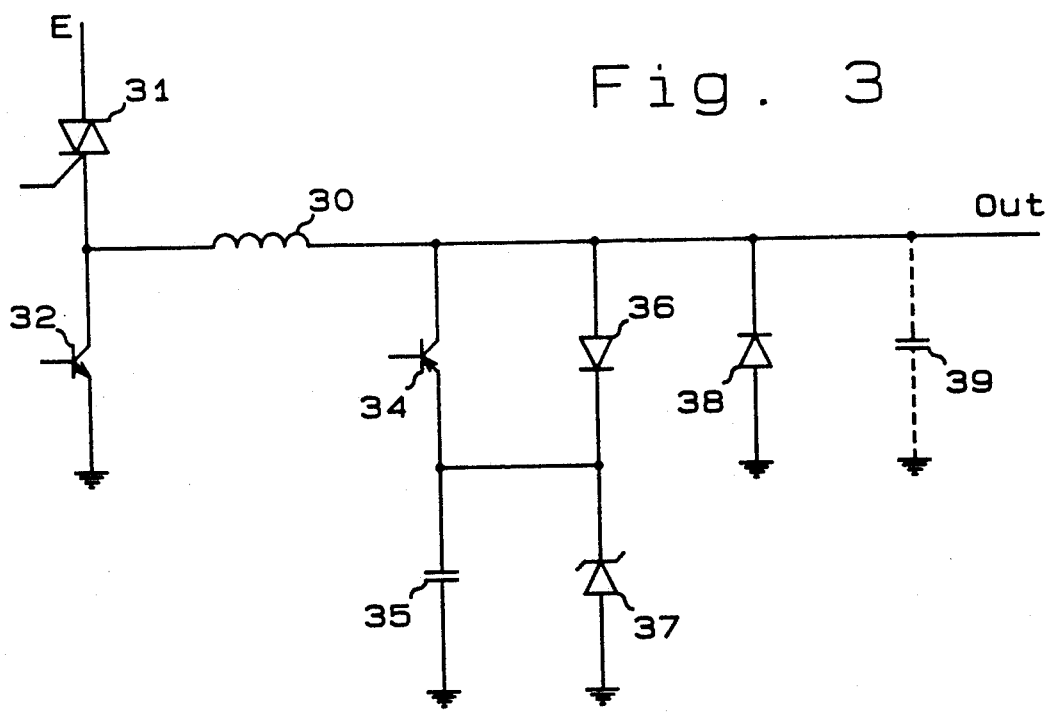
FIG. 3 is an embodiment of the capacitive load driver with triac and second power supply.

FIG. 3 is an embodiment of the capacitive load driver with triac and second power supply. The triac 31 represents the first switching means and replaces the components 21, 23, 25 and 26 of FIG. 2. The NPN transistor 32 represents the second switching means and corresponds to the transistor 22 of FIG. 2. The output components 38 and 39 correspond to 28 and 29 of FIG. 2 respectively. Consequently, on-state voltages of the respective components are assumed to be zero. The inductor 30 is coupled to the cathode of the triac 31 and collector of the transistor 32, and further to the output.

The triac 31 is closed as to switch V from the low to high level. This is accomplished by momentarily coupling the gate of the triac 31 via a resistor to E. When $t = \pi/\omega$, J is zero, V reaches its peak equal to 2E and the triac 31 turns off automatically. The transistor 32 is closed as to switch V to low level. This is accomplished by coupling the base of the transistor 32 via a resistor to E. Moreover, the gate of the triac 31 is coupled via a resistor to ground, whereas triac 31 is reverse biased and remains nonconductive. When $t = \omega/(2\omega)$, V reaches zero and J reaches peak equal to $-2\omega CE$. The transistor 32 is opened, whereby the triac 31 takes over J automatically. The diode 38 also conducts, whereby the voltage across the inductor 30 is E and J is falling linearly. When $t = 2/\omega$, J is zero and V can be switched again from low to high level.

It may be necessary to maintain the output voltage in the high state for a long period of time. However, the charge stored in the load capacitor and output capacitor 39 is eventually bled off. Therefore, the driver further includes a capacitive means for storing a second supply voltage, and a third switching means for selectively applying the second supply voltage to the output. Maximum value of the second supply voltage is near 2E.

Specifically, the capacitor 35 is coupled to ground and stores the second supply voltage. The PNP transistor 34 has the emitter and collector coupled to the capacitor 35 and output respectively. The diode 36 is coupled in parallel with the transistor 34 and applies V to the capacitor 35 as to charge it to the peak value of V. The transistor 34 is turned on in order to apply the second supply voltage to the output and maintain the high voltage level thereat. This is accomplished by coupling the base of the transistor 34 via a resistor to ground. The zener diode or transient voltage suppressor 37 is coupled across the capacitor 35 for limiting the second supply voltage. This is necessary if a leakage current charges the capacitor 35. Moreover, the diode 36 is coupled between the diode 37 and output, whereby V is also limited.

The FIG. 2 and 3 embodiments each can be used as the buffer 16 of the FIG. 1 driver circuit. In particular, ground connection of the buffer 16 goes to the gate of the transistor 49. The capacitor 15 acts as supply voltage source and provides E which is negative. Accordingly, the FIG. 2 and 3 embodiments can be adapted by reversing polarity of the diodes and changing conductivity types of the transistors from NPN to PNP and vice versa.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:
1. Driver obtaining binary output voltage having essentially one polarity on substantially capacitive load, comprising:
   a node;
   an inductive means coupled to the node for attaining a current having one or the other polarity and providing the binary output voltage;
   a voltage source means coupled to ground for providing a supply voltage;
   a first switching means coupled to the node for selectively applying the current having any polarity to the voltage source means;
   a second switching means coupled to the node for selectively applying the current having the one polarity to ground; and
   a diode means connected across the capacitive load for applying the binary output voltage having the reverse polarity to ground.
2. Driver of claim 1 wherein the first switching means includes a first and second switches conducting the current having the one and other polarities respectively.
3. Driver of claim 2 wherein the first and second switches each include a transistor and diode coupled in series therewith.
4. Driver of claim 1 wherein the first switching means includes a triac.
5. Driver of claim 1 wherein the second switching means includes a transistor.
6. Driver of claim 1 wherein the second switching means includes a second diode means for applying the current having the other polarity to ground.
7. Driver of claim 1 wherein the diode means includes a zener diode or transient voltage suppressor.
8. Driver of claim 1 further including:
   a capacitive means coupled to ground for storing a second supply voltage; and
   a third switching means for selectively applying the second supply voltage to the binary output voltage.
9. Driver of claim 8 wherein the third switching means includes a transistor and diode coupled in parallel therewith.
10. Driver of claim 8 further including a second diode means for limiting the second supply voltage.
11. Driver of claim 10 wherein the second diode means includes a zener diode or transient voltage suppressor.
12. Driver of claim 1 further including a capacitive means for increasing a capacitance of the load.

* * * * *